United States Patent [19]
DeAndrea et al.

[11] Patent Number: 5,708,743
[45] Date of Patent: *Jan. 13, 1998

[54] LIGHT BENDING DEVICES

[75] Inventors: John Joseph DeAndrea, Lawrenceville, N.J.; Francis Thomas Delahanty, Newton, Pa.; Allan Heiney, Highland Park, N.J.; Bill Henry Reysen, Stewartsville, N.J.; Donald Simon, Princeton, N.J.; Richard Gregory Wheeler, Robbinsville, N.J.

[73] Assignee: The Whitaker Corporation, Wilmington, Del.

[*] Notice: The term of this patent shall not extend beyond the expiration date of Pat. No. 5,515,468.

[21] Appl. No.: 632,942

[22] Filed: Apr. 16, 1996

Related U.S. Application Data

[63] Continuation of Ser. No. 388,664, Feb. 14, 1995, Pat. No. 5,515,468, and a continuation of Ser. No. 21,954, Feb. 23, 1993, abandoned.

[51] Int. Cl.⁶ .................................................. G02B 6/36
[52] U.S. Cl. ................................. 385/88; 385/93; 385/92
[58] Field of Search ............................... 385/2, 8, 14, 33, 385/36, 88–94

[56] References Cited

U.S. PATENT DOCUMENTS

| | | | |
|---|---|---|---|
| 4,186,995 | 2/1980 | Schumacher | 350/96.2 |
| 4,222,629 | 9/1980 | Dassele et al. | 350/96.2 |
| 4,273,413 | 6/1981 | Bendiksen et al. | 350/96.2 |
| 4,307,934 | 12/1981 | Palmer | 350/96.2 |
| 4,718,744 | 1/1988 | Manning | 350/96.2 |
| 4,756,590 | 7/1988 | Forrest et al. | 350/96.15 |
| 4,842,360 | 6/1989 | Caro et al. | 350/96.18 |
| 4,897,711 | 1/1990 | Blonder et al. | 357/74 |
| 4,911,519 | 3/1990 | Burton et al. | 350/96.2 |
| 4,935,856 | 6/1990 | Dragoon | 362/307 |
| 4,979,791 | 12/1990 | Bowen et al. | 350/96.17 |
| 5,042,891 | 8/1991 | Mulholland et al. | 385/93 |
| 5,056,881 | 10/1991 | Bowen et al. | 359/19 |
| 5,073,003 | 12/1991 | Clark | 385/33 |
| 5,127,075 | 6/1992 | Althaus et al. | 385/94 |
| 5,347,605 | 9/1994 | Isaksson | 385/92 |
| 5,416,870 | 5/1995 | Chun et al. | 385/88 |
| 5,515,468 | 5/1996 | DeAndrea et al. | 385/88 |

FOREIGN PATENT DOCUMENTS

| | | | |
|---|---|---|---|
| 2 162 336 | 1/1986 | European Pat. Off. | G02B 6/42 |
| 0 375 251 | 6/1990 | European Pat. Off. | G02B 6/42 |
| 0 404 053 | 12/1990 | European Pat. Off. | G02B 6/42 |
| 35 43 558 | 12/1985 | Germany | G02B 6/42 |
| 3031808 | 2/1991 | Japan | G02B 6/42 |

OTHER PUBLICATIONS

European Search Report; European Patent Office; Application No. EP 94 30 1015.5.

*Primary Examiner*—Phan T. H. Palmer

[57] ABSTRACT

Improved connectors for optically coupling a fiber optic transmission line and an opto-electronic device electrically interfaced to a substrate. The improved connectors include the opto-electronic device being mounted on the substrate, such as a printed circuit board, and means for mounting the fiber optic transmission line to the substrate such that the operative axis of the opto-electronic device is substantially not coincidental with the light transmission axis of the fiber optic transmission line. The connectors also require light bending means in operative optical association with said opto-electronic device for directing along the light transmission axis of the fiber optic transmission line at least a portion of the light emitted from said opto-electronic device or for directing along the operative axis of said opto-electronic device at least a portion of the light emitted from said fiber optic transmission line. Applicants have discovered that a connector provided in accordance with the present invention overcomes many of the difficulties associated with prior art connectors of this type.

1 Claim, 12 Drawing Sheets

LIGHT BENDING DEVICES

This application is a Continuation of application Ser. No. 08/388,664 filed Feb. 14, 1995 now U.S. Pat. No. 5,515,468, and a Continuation of application Ser. No. 08/021,954 filed Feb. 23, 1993 now abandoned.

FIELD OF THE INVENTION

The present invention relates to fiber optic coupling devices, and more particularly to coupling devices for optically coupling a fiber optic cable and an opto-electronic device.

BACKGROUND OF THE INVENTION

Fiber optic transmission lines, also referred to as fiber optic cables, are finding ever increasing uses for transmission of telecommunication and data signals, which are typically analog and digital in nature, respectively. The use of such fiber optic transmission lines has several advantages over conventional electrical cables. For example, fiber optic materials frequently possess a cost advantage over electric cables. Furthermore, the power required to drive optic signals is frequently less than that required for many electrical cables. It may also be noted that optical transmission of data provides an enhanced rate of information transfer over longer distances.

In typical applications, fiber optic connectors require a coupling device which effectively optically couples the fiber optic transmission line with an opto-electronic device (OED). The OED is further electronically coupled by two or more lead wires to electronic circuits which operate in conjunction with the OED. In a large number of important applications, such electronic circuits, including integrated circuits, are mounted on a printed circuit board or ceramic substrate. Furthermore, electronic equipment such as computers, diagnostic devices, analytical equipment and the like frequently utilize two or more printed circuit boards stacked in a high density, parallel fashion in order to satisfy the continuing need for electronic equipment of reduced size. To accommodate the use of optical transmission devices in such densely packed parallel arrangements of circuit boards, it is commonly required that the fiber optic cable enter the printed circuit board along a path substantially parallel to the board with which it will interface.

In order to accommodate the need for a parallel arrangement between the fiber optic cable and the associated printed circuit board, heretofore used connectors have utilized a packaging arrangement in which the OED is mounted in a tubular housing adapted to coaxially mate with the ferrule of the fiber optic cable. Such tubular housings are commonly mounted to a casing which is in turn mounted to the printed circuit board containing the associated electronic circuits.

Conventional fiber optic connectors are disclosed in the following U.S. Pat. Nos. 4,186,995—Schumacher; 4,222,629—Dassele et al.; 4,273,413—Bendiksen et al.; 4,307,934—Palmer; and 4,911,519—Burton et al.

Optical connectors of the type disclosed in the foregoing patents, while possessing certain desirable characteristics, nevertheless have several disadvantages which impair the effectiveness of such devices. For example, applicants have recognized that such devices possess a relatively high degree of parasitic inductance, capacitance and resistance as a result of the numerous soldered and/or wire-bonded connections between the OED and the printed circuit board. Furthermore, such coupling devices, and the assembly thereof with other electronic components entail relatively expensive and complex manufacturing procedures. Such manufacturing procedures are also undesirable since they produce a high level of tolerance build-up and frequently require active alignment procedures as part of the final assembly.

SUMMARY OF THE INVENTION

The present invention provides improved connectors for optically coupling a fiber optic transmission line and an OED electrically interfaced to a substrate. The improved connectors include the OED being mounted on the substrate, such as a printed circuit board, and means for mounting the fiber optic transmission line to the substrate such that the operative axis of the OED is substantially not coincidental with the light transmission axis of the fiber optic transmission line. The connectors also require light bending means in operative optical association with said OED for directing along the light transmission axis of the fiber optic transmission line at least a portion of the light emitted from said OED or for directing along the operative axis of said OED at least a portion of the light emitted from said fiber optic transmission line. Applicants have discovered that a connector provided in accordance with the present invention overcomes many of the difficulties associated with prior art connectors of this type.

The present invention also provides coupling devices which are especially well adapted for use with the present connectors. In preferred embodiments, the coupling device includes an optical sleeve having a first end, a second end, and a bore defining an opening in said first end and an optical path to the second end, the bore being adapted to operatively associate with the optical transmission line through the opening in the first end such that the light transmission axis of the fiber optic transmission line is substantially coincidental with the axis of the bore. Disposed in operative optical association with the optical sleeve is a light bending means. The light bending means, which is preferably located at and/or closes the opening in the second end of the bore, is in operative optical association with the optical path defined by the bore for directing along the operative axis of an OED at least a portion of the light emitted from a fiber optic transmission line connected to the sleeve. The light bending means may alternatively or concurrently also provide means for directing along the light transmission axis of the fiber optic transmission line at least a portion of light emitted from an OED in optical association with the light bending means.

It is contemplated that the coupling devices and connectors of the present invention may be utilized in any one of several well known connector formats. For example, the present invention may be utilized in SC connectors, ST connectors and FDDI connectors. Connectors arranged in the "SC" format are those well known connectors manufactured in accordance with licenses provided by NTT of Japan to be adopted as a standard by ANSI X3T9.5, FDDI, LCF-PMD. The "ST" format connectors referred to herein are those connectors made in accordance with the well known format set forth by AT&T. The "FDDI" format refers to those connectors manufactured in accordance with well known formats set forth by AMP and standardized and exemplified by 1S0-ICE-9314-3FDDI-PMD.

DETAILED DESCRIPTION OF PREFERRED EMBODIMENTS

Figure 1:
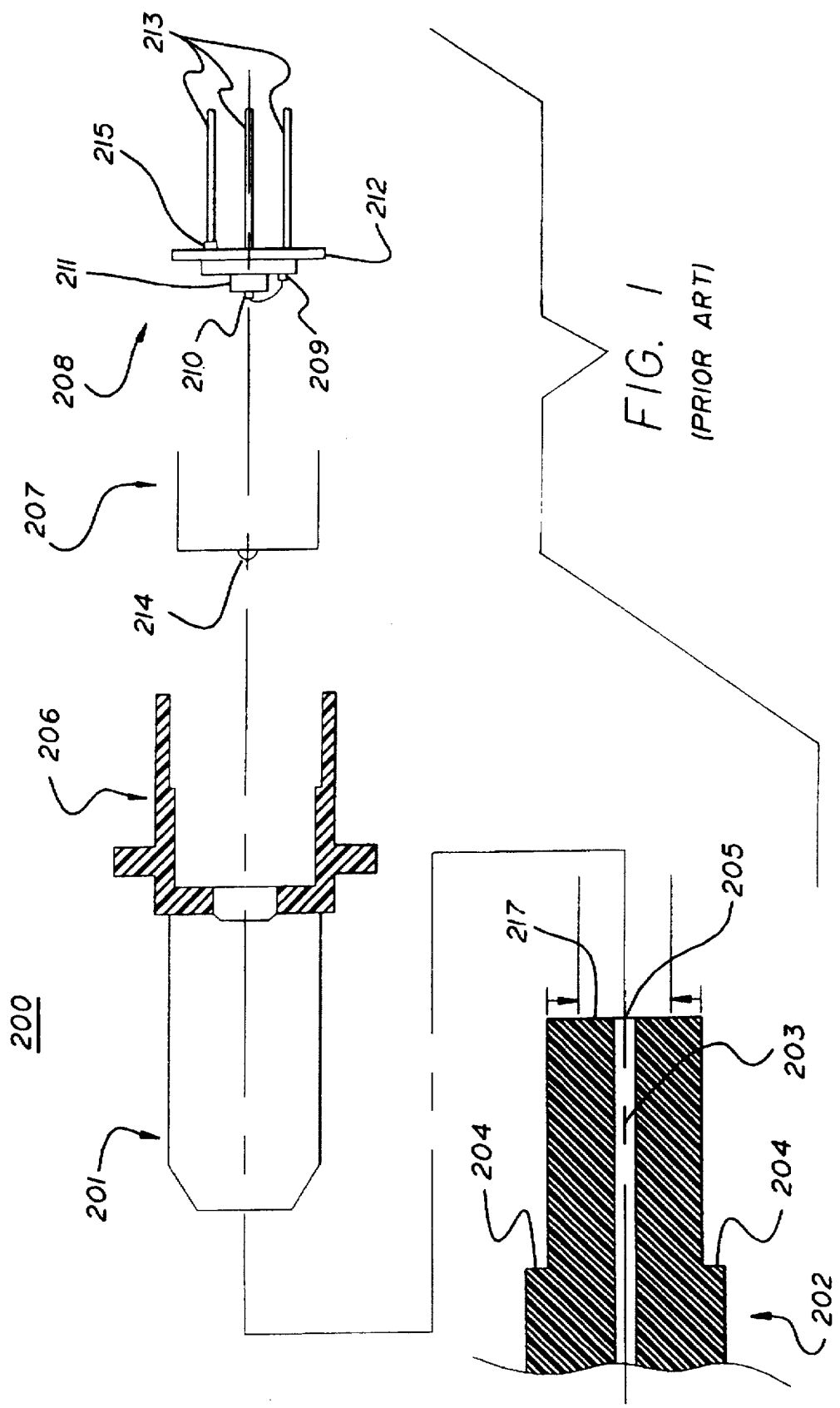
FIG. 1 is a semi-schematic representation of a typical prior art coupling device showing the configuration and assembly thereof.

A typical prior art device for optically coupling .an OED to a fiber optic transmission line is illustrated in FIG. 1. The terms "fiber optic transmission line" and "optical fiber" are used herein to refer to single or multiple-strand light guides. The optical fibers may consist, for example, of glass or suitable plastic clad or coated with a material having an index of refraction lower than that of the fiber itself. This will cause light to be totally internally reflected, or refracted by a gradient in the index of the fiber core, substantially without loss as is well known in the art.

According to such prior arrangements, a tubular sleeve 200, sometimes referred to as an "active device mount" or "ADM" has an end 201 for accepting an optical ferrule 202 having a fiber optic transmission line 203 coaxially mounted therein. Internal details in end 201 define the location of fiber end 205 by retaining ferrule end 217.

The ADM 200 also includes a flanged end 206 which is shown in cross hatch for clarity. The flanged end 206 is adapted to permanently mount an assembly, sometimes known as a "TO assembly" comprising a cap 207 and a header assembly, designated generally as 208. Header assembly 208 can be a hybrid microelectronic assembly which includes one or more integrated circuits (ICs) or passive components 209 in addition to the OED. The ICs may be a preamplifier and/or a postamplifier for amplifying and/or quantizing current signals received from a photodiode OED. The ICs may also be drive circuits for modulating and/or controlling a light emitting diode OED. Passive components can be electrical parts, such as resistors or capacitators. The header assembly includes an insulating plate 211, such as a suitable ceramic submount, on which the ICs and OED are mounted. The insulating plate 211, in turn, is mounted on a metallic header 212 through which leads 213 extend. Some of the leads 213 are insulated by an insulating sleeve 215 extending through an aperture in the base plate 212. All three leads or pins 213 may not be necessary, but at least one is used for an input or output signal, one for electrical power, and one for a ground connection.

Prior coupling devices of the type shown in FIG. 1 have certain shortcomings. For example, such prior art coupling devices require that a large number of components be assembled and aligned in a relatively precise manner. That is, it is necessary to precisely mount and fix the OED 210 in the center of the header assembly, within a certain tolerance. Furthermore, the header assembly 208 must be mounted and fixed to cap 207 to form a subassembly, once again centered within a certain tolerance limit. This subassembly must be formed such that the OED 210 is in alignment with lens portion 214 of cap 207, again, within ceratin tolerances. The subassembly must then be mounted and fixed, within certain tolerance limits, to the ADM 200 such that the OED is aligned with the axis of the bore therein. It is seen, therefore, that the tolerances associated with the assembly of such prior art packages are cumulative and can produce a substantial error in certain important alignment considerations. Such error can result in substantial loss in signal strength as light is transmitted through the coupling device. The errors which are accumulated can produce unrecoverable alignment losses on the order of 5 decibels.

The difficulties associated with the tolerance build-up in such manufacturing procedures can be overcome, at least in part, by utilizing "active alignment" techniques to mount the subassembly to the ADM 200. In the active alignment process, the OED is temporarily activated, a fiber optic ferrule 202 is placed in the end 201 of the ADM 200, and the mounting position of the subassembly is determined by monitoring the optical signal transmitted or received through or from cable 203 as the position of the subassembly is adjusted. While active alignment may improve the optical efficiency of such coupling devices, it nevertheless adds to the complexity of the manufacturing process and the cost of the coupling device.

Figure 2:
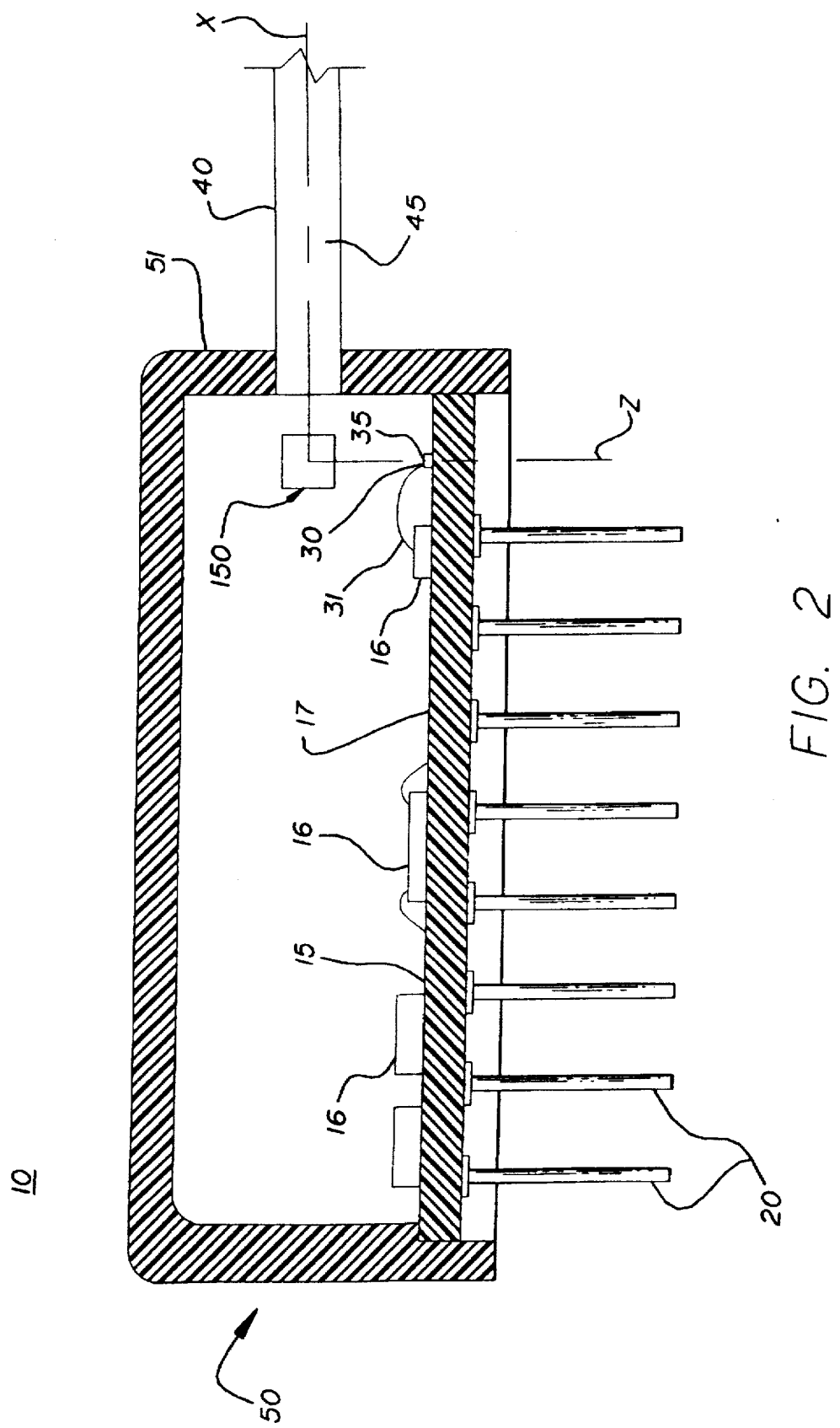
FIG. 2 is a semi-schematic drawing showing a fiber optic coupling device in accordance with one embodiment of the present invention.

Referring now to the drawings, and particularly to FIG. 2, the components associated with a fiber optic connector in accordance with one embodiment of the present invention are disclosed semi-schematically. A hybrid circuit element, designated generally as 10, comprises a substrate 15 having connecting pins 20 depending therefrom and adapted to mate with a further substrate (not shown). As the term is used herein, "substrate" refers to an electronic component having electronic circuit elements mounted thereto or forming part thereof. In typical embodiments, the substrate 15 comprises a printed circuit board (PCB), printed wiring board (PWB) and/or similar substrates well known in the art.

According to preferred embodiments, the hybrid circuit element 10 is a dual-inline package (DIP) adapted to be mounted to the motherboard or some other systemboard of an electronic device. The substrate 15 contains various circuit elements 16 mounted to surface 17 thereof. The printed circuit board may include, for example, a plurality of integrated chips. Such chips may represent, for example, a pre-amplifier or post-amplifier and additional electronic circuits. The type and nature of such circuit elements, and the techniques and methods for mounting such elements to the substrate 15 are well known in the art and do not form part of the present invention.

An OED 30 is mounted, and preferably surface mounted, to the surface 17 of substrate 15. As the term is used herein, "opto-electronic device" refers to a device which converts electrical current to light and/or light to electrical current. The term "light" refers generally to electromagnetic radiation, and preferably to those wavelengths of electromagnetic radiation to which semi-conductive material is, or can be made, sensitive, whether or not such light is actually visible to the unaided eye. Examples of opto-electronic devices include lasers (e.g., double channel, planar buried heterostructure (DC-PBH), buried crescent (BC), distributed feedback (DFB), distributed bragg reflector (DBR), etc.), light emitting diodes (LEDs) (e.g. surface emitting LED (SLED), edge emitting LED (ELED), super luminescent diode (SLD), etc.) or photodiodes (P Intrinsic N, referencing the layout of the semiconductor (PIN), avalanche photodiode (APD), etc.). By surface mounting the OED 30 to substrate 15, it will be appreciated that certain of the required electrical connections between the OED and the substrate can be made through contact pads or the like on the surface 17 of the substrate, as is well known. It will be appreciated by those skilled in the art that such means for providing electrical connections produce a substantial decrease in the level of parasitic capacitance and inductance as compared to prior art electrical connections, as shown in FIG. 1, between the OED 210 and the ICs 209, and between leads 213 and the printed circuit board. Furthermore, mounting of the OED 30 onto the substrate 15 enables the distance between the device and its associated circuit elements to be minimized. This further reduces the parasitic capacitance and inductance associated with present connectors. A wire bond 31 may also be utilized in accordance with the present invention to connect the OED 30 to one or more additional circuit elements 16 on the substrate 15.

Figure 3:
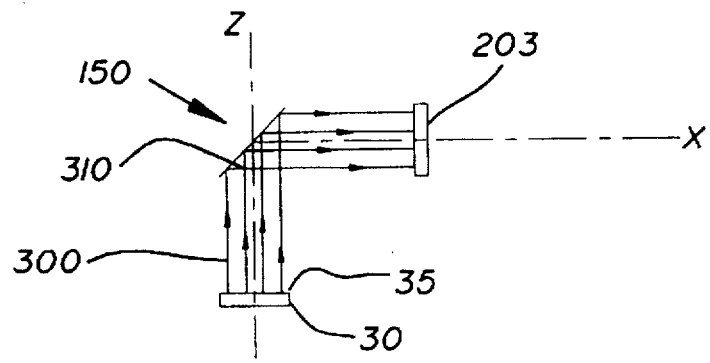
FIG. 3 is a first schematic representation showing a first light bending means in operative optical association with a coherent source of light.
Figure 4:
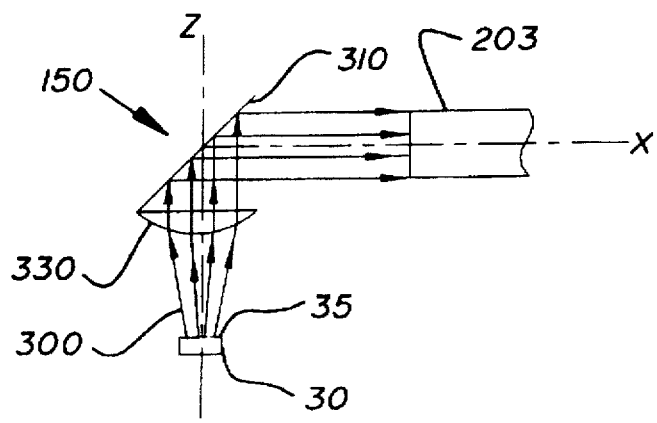
FIG. 4 is a second schematic representation of a second light bending means in operative optical association with a non-coherent source of light.
Figure 5:
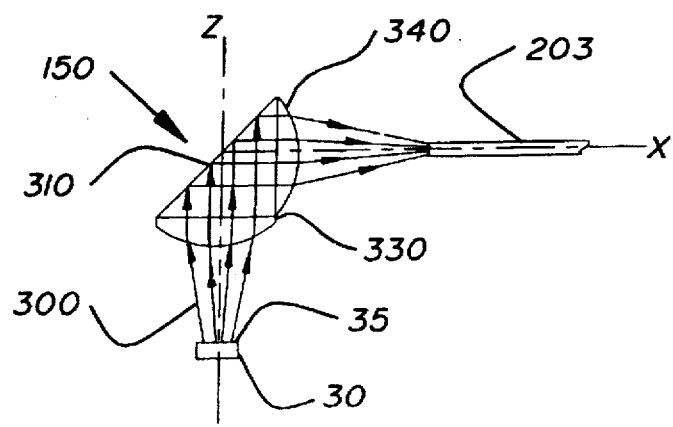
FIG. 5 is a third schematic representation of a third light bending means in operative optical association with a non-coherent source of light.

It is contemplated that the operative axis Z of the OED 30 may be disposed at any one of numerous angles with respect to the substrate. For the purposes of simplicity and compatibility with conventional assembly methods, however, the operative axis of the OED 30 is preferably substantially normal to the plane of the substrate 15. As is understood by those skilled in the art, opto-electronic devices typically include an "active area" or "active surface" which emits light or is sensitive to the impingement of light thereon. As the term is used herein, the "operative axis" of such devices refers to the axis which is about normal to and passes through about the center of such active area or active surface. As is illustrated in FIG. 2, for example, the active area of OED 30 comprises a substantially flat surface 35 which is substantially parallel to surface 17 of substrate 15. Accordingly, the operative axis Z of OED 30 is substantially normal to the surface 17 of substrate 15. It will be seen, therefore, that for opto-electronic devices which are LEDs, for example, the optical axis Z corresponds substantially to the average direction of light emitted therefrom, as illustrated in FIGS. 3–5.

The optical coupling device of the present invention also includes an optical sleeve, shown schematically as 40 in FIG. 2, for coupling with a fiber optic transmission line, and particularly with a fiber optic transmission line 203 contained in a ferrule 202 of the type shown in FIG. 1. In preferred embodiments, the optical sleeve 40 is attached to, and in certain embodiments preferably is integrally formed with, casing 50. Casing 50 is mounted to substrate 15 and preferably provides the surface 17 of the substrate with protection from the environment. Optical sleeve 40 preferably extends from an endwall 51 of the casing 50 and defines a bore or cavity 45. While it will be appreciated by those skilled in the art that the precise shape and size of optical sleeve 40 and the bore 45 defined thereby may vary widely, depending in large part upon particular size and shape of the fiber optic ferrule with which it is adapted to couple, the optical sleeve preferably defines a substantially cylindrical bore. The configuration of the bore 45 of optical sleeve 40 is adapted to operatively associate with a fiber-optic transmission line such that the light transmission axis thereof is substantially coincidental with the axis X of the bore 45. For a fiber optic transmission line which emits light, the term "light transmission axis" refers to the average direction of light emitted from the fiber optic cable. For a fiber optic transmission line which is adapted to receive light, the term "light transmission axis" refers to the axis of the transmission line or the average axis of the several lines which define the receiving end of the fiber optic cable. In FIG. 2, this axis is designated by the dashed line X. In preferred embodiments of the type shown in FIG. 2, therefore, the light transmission axis and the axis 45 of bore 40 are substantially parallel to surface 17 of substrate 15 and are substantially normal to the optical axis Z of the active area of OED 30. Furthermore, it is preferred that the operative axis Z of the OED 30 substantially intersects the light transmission axis X, and it is even further preferred that the angle of this intersection be about 90°.

The present optical coupling device also comprises light bending means, shown in block form as 150, in operative optical association with the OED 30 and with the optical sleeve 40 for altering the direction of light. As used herein, the phrase "operative optical association" refers to the light bending means being positioned such that it is in the path of at least a portion of the light emitted from the light emitting device and such that the light receiving device is in the path of at least a portion of the light whose direction is changed by the light bending means. It will be appreciated by those skilled in the art that the present coupling device is thus effective for use in embodiments in which OED 30 comprises a light emitting device or in which the OED is a light receiving device. It follows, of course, that the fiber optic transmission line may therefore also be a light receiving device or a light transmitting device.

Since the optical sleeve of the present invention provides an optical path for light emitted from or received by the fiber-optic transmission line, operative optical association of the light bending means with the optical sleeve ensures that light is directed along the appropriate optical path when the fiber optic transmission line is mounted in the optical sleeve. According to preferred embodiments, the light bending means comprises means for altering the direction of a substantial portion of the light emitted by the light emitting device such that a substantial portion of emitted light is received by the light receiving device. For embodiments in which the fiber optic transmission line comprises a 62 micron core gradient index fiber and the opto-electronic device comprises a SLED, coupling efficiency is expected to be from about 5 to about 10%. For embodiments in which the fiber optic transmission line comprises a 62 micron core gradient index fiber and the opto-electronic device comprises a PIN, coupling efficiency is expected to be from about 75 to about 98%.

It will be appreciated by those skilled in the art that the present invention affords optical connectors and coupling devices with benefits and properties not heretofore attainable with prior art devices. For example, those skilled in the art will appreciate that when the OED is a detector, the image of the fiber in the plane of the opto-electronic device will generally be smaller than its active area of the receiver. In such embodiments, it is expected that the coupling efficiency of the present connectors and coupling devices will be at least about 75%, and preferably from about 85 to about 98%, with the precise efficiency depending upon the various design criteria used in accordance with the present invention. As the term is used herein, coupling efficiency refers to the ratio of coupled light to the total integrated amount available, expressed as percent. Furthermore the present invention provides for coupling devices in which the OED may have active areas which are substantially larger than those available in the prior art. This beneficial characteristic is due, at least in part, to the preferred surface mounting arrangement of the present invention, which affords reduced parasitic capacitance. A subsequent advantage of larger active areas is an increased tolerance range for placement of the OED on the printed circuit board and may, in certain embodiments, eliminate the need for active alignment.

The present invention also provides advantages for embodiments in which the opto-electronic device is a SLED. In such devices, it is expected that the coupling efficiency of the connectors and coupling devices will range from about 5 to about 10%. Those skilled in the art will appreciate, however, that a much larger fraction of the emitted light may be focused into the image plane of the fiber optic transmission line. It is expected, using aspheric surfaces for example, that from about 40% to about 80% of the light emitted from the opto-electronic device may be focused onto such image plane. The presence of such a high percentage of focused light at the image plane provides at least two important benefits. First, it allows for acceptable performance of the coupling device even in those circumstances in which the tolerance fit between the ferrule and the bore would be otherwise unacceptable. Secondly, this feature of the present invention minimizes negative effects associated with errors in placement of the LED on the printed circuit board. As stated above, it may eliminate the need for active alignment.

The particular structure of the light bending means according to the present invention may vary widely, depending upon such factors as the particular emitting and receiving device being coupled, the portion of the light whose direction is to be altered, and the relative positions of the OED and the optic sleeve. In general, however, it is preferred that the light bending means comprises reflecting means in operative optical association with the OED and with the optical sleeve for reflecting at least a portion of light emitted by the light emitting device onto the light receiving device. It will be appreciated by those skilled in the art that numerous structures are capable of performing this function. For example, one or more mirrors disposed at the appropriate angle relative to the operative axis of the OED and the light transmission axis may be used to achieve this result. According to preferred embodiments described in more detail hereinafter, such reflective means comprises a reflective surface, such as a prism having an internal surface disposed at the appropriate angle with respect to the axes of the OED and the fiber optic transmission line. In order to minimize signal loss associated with the present coupling devices, it is preferred that the reflective means comprises a total internal reflection prism. In embodiments in which the OED comprises a light emitting device, it is contemplated that the light emitted by the device may be coherent or non-coherent. It will be appreciated, for example, that light emitted from the active area of OED may be emitted in the form of a beam of substantially parallel light rays centered on and substantially parallel to the operative axis of the device. In such embodiments, the light bending means preferably comprises light reflecting means positioned in the path of the beam. A ray tracing diagram which schematically shows the use of a reflective means in operative association with an OED and a fiber optic line is shown in FIG. 3. The rays 300 of light emitted from the OED 30 are substantially parallel to the operative axis Z of the OED and impinge upon a reflective surface 310. Since the reflective surface 310 is preferably a substantially flat surface disposed at an angle of 45° with respect to both the operative axis Z and the light transmission axis X of the fiber optic cable 203, the direction of the light rays 300 are altered so as to be substantially parallel to the light transmission axis X. Since the path of light travel is reversible, this same light bending means may be used for embodiments in which the fiber optic transmission line is the light emitting device.

It will be appreciated by those skilled in the art that the particular structure of the light bending means 150 may be readily modified in view of the disclosure contained herein to optimally accommodate different types and arrangements of light emitting devices and receiving devices. For example, the OED 30 may be a light emitting device which produces a substantially incoherent source of light, and in such embodiments it is preferred that light bending means 150 include a collimating element, such as lens 330, in operative optical association with the OED, as shown schematically in the ray tracing diagram of FIG. 4. The principal purpose of the collimating element of the present invention is to reduce the degree of divergence of the rays emitted from the opto-electronic device or the fiber optic cable. It will be appreciated that the schematic representation of the collimated light rays in FIG. 4 as being parallel is for the purpose of convenience and illustration, but is not necessarily a representative tracing of the light rays. The collimating element preferably comprises an optical power surface, such as positive, aspheric lens. Such a collimating element is preferably operatively associated with the OED 30 by aligning the optical axis of the lens 330 with the operative axis Z of the OED 30. In this way, it is contemplated that a substantial portion of the light rays 300 emitted from such a non-coherent OED 30 impinges upon the surface of the lens 330. In order to align the collimated beam of light with the light transmission axis X, the light bending means illustrated in FIG. 4 also preferably includes a reflective surface 310 disposed at an angle of about 45° with respect to each axis. In this way, the direction of the light rays are altered so as to be directed generally along the light transmission axis X of optic fiber 203.

According to certain preferred embodiments, as shown in the ray tracing of FIG. 5, the light bending means 150 further contains a second lens 340 for focusing the light reflected from surface 310. Lens 340 also comprises an optical surface with power such as an optical aspheric lens. The lens 340 is preferably selected to focus the rays of light 300 reflected by the surface 310 onto an area which corresponds to about the expected location of the receiving end of the fiber optic transmission line 203.

The light bending means disclosed in FIGS. 2–5 have been described for embodiments in which the OED 30 is the emitter and the fiber optic cable 203 is the receiver. It will be appreciated by those skilled in the art, however, that structures for altering the direction of light travel are generally reversible. The same or similar arrangements as those disclosed in FIGS. 2–5 will be effective in the reverse situation, that is, a situation in which the OED 30 is the receiver and the fiber optic cable 203 is the emitter. It is thus seen that the present invention provides effective coupling for opto-electronic devices which are photoelectric detectors as well as those which are light emitters. As shown in the ray tracing of FIG. 5, a preferred light bending means comprises a first lens element 340, a reflective surface 310 and a second lens element 330. An embodiment of this type is disclosed in further detail hereinafter.

The embodiments of FIGS. 2–5 illustrate embodiments in which the axis of the fiber-optic transmission line intersects at an angle of about 90° with respect to the operative axis of the OED 30. While it is contemplated that such an arrangement is generally preferred for the purposes of simplicity, manufacturing ease and efficiency, it will be appreciated that embodiments having other relationships between the light transmission axis and the operative axis are possible within the scope of the present invention.

Figure 6:
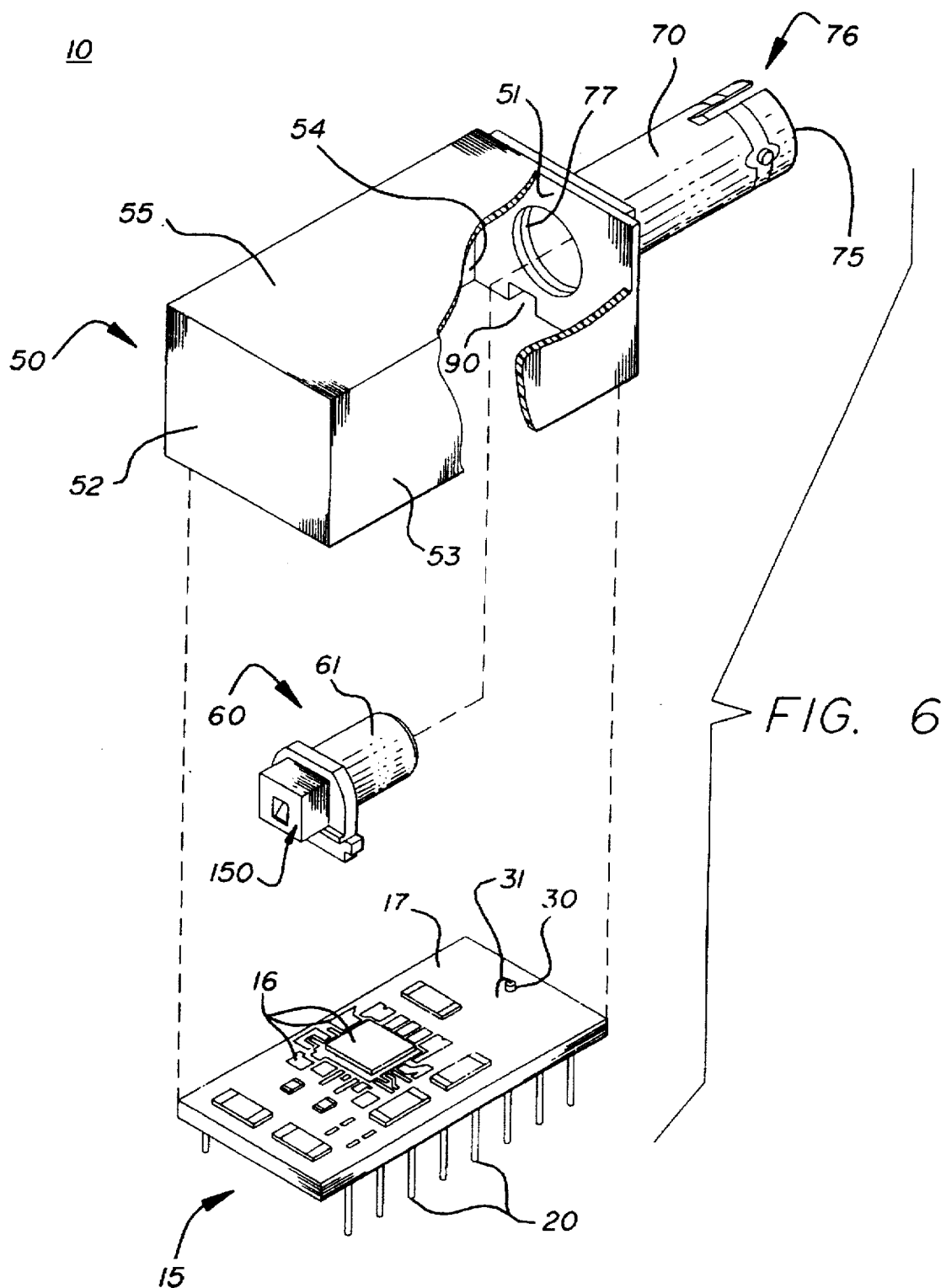
FIG. 6 is a cut-away, exploded perspective view of a connector in accordance with one embodiment of the present invention in which the top and side walls of the casing are cut-away in order to facilitate illustration of the assembly of the connector.

With reference now to FIG. 6, a first connector assembly in the form of a dual-inline package (DIP) 10 is disclosed. DIP 10 comprises a conventional 16-pin DIP. By mounting the OED 30, including all its associated electronic circuitry, on a printed circuit board 17 contained in DIP 10, applicants have found that the parasitic capacitance and inductance of the present fiber optic coupling system is substantially reduced relative to such parasitic noise of prior art coupling devices. This is due, in large part, to the presence in prior art coupling devices of at least two soldered and/or wire bonded leads extending from the OED (and/or its mounting substrate) to the printed circuit board contained in the DIP.

The assembly 10 comprises a substrate 15, a casing 50, and an optical coupling device 60. Substrate 15 includes electronic circuit components 16 disposed on a top surface 17 thereof. Descending from the lower surface (not shown) of substrate 15 are pins 20 adapted to interface with a further substrate, such as the motherboard or systemboard of an electronic device. Also mounted to the top surface 17 of substrate 15 is OED 30. The OED is surface mounted to the printed circuit board in known fashion and additionally is wire bonded to circuit elements on the printed circuit board via wire bond 31. In order to assist in the dissipation of heat, such OED 30 may also be coupled, through copper vias, for example, to a heat sink, such as a large copper ground plane, within the printed circuit board.

Box-like casing 50 is adapted to be mounted to and substantially cover the top surface 17 of printed circuit board 15. The casing 50 preferably comprises two substantially parallel sidewalls 53 and 54, and two substantially parallel endwalls 51 and 52 connecting the sidewalls. A top wall 55 connecting the end walls 51 and 52 and the side walls 53 and 54 is also provided. Connected to endwall 51, and preferably integrally connected to endwall 51, is a mating sleeve 70 of typical construction adapted to mate with the mounting fixture of a fiber optic connector. Such mounting fixtures and the ferrules with which they are associated are well known in the art and require no further description herein. Mating sleeve 70 has a substantially cylindrical bore or cavity 75 which is adapted to removably receive at the first end 76 of the sleeve the fiber optic transmission line. The bore also defines an opening 77 in the sidewall 51 which is adapted to permanently receive the optical sleeve portion 61 of the coupling device 60.

Figure 7:
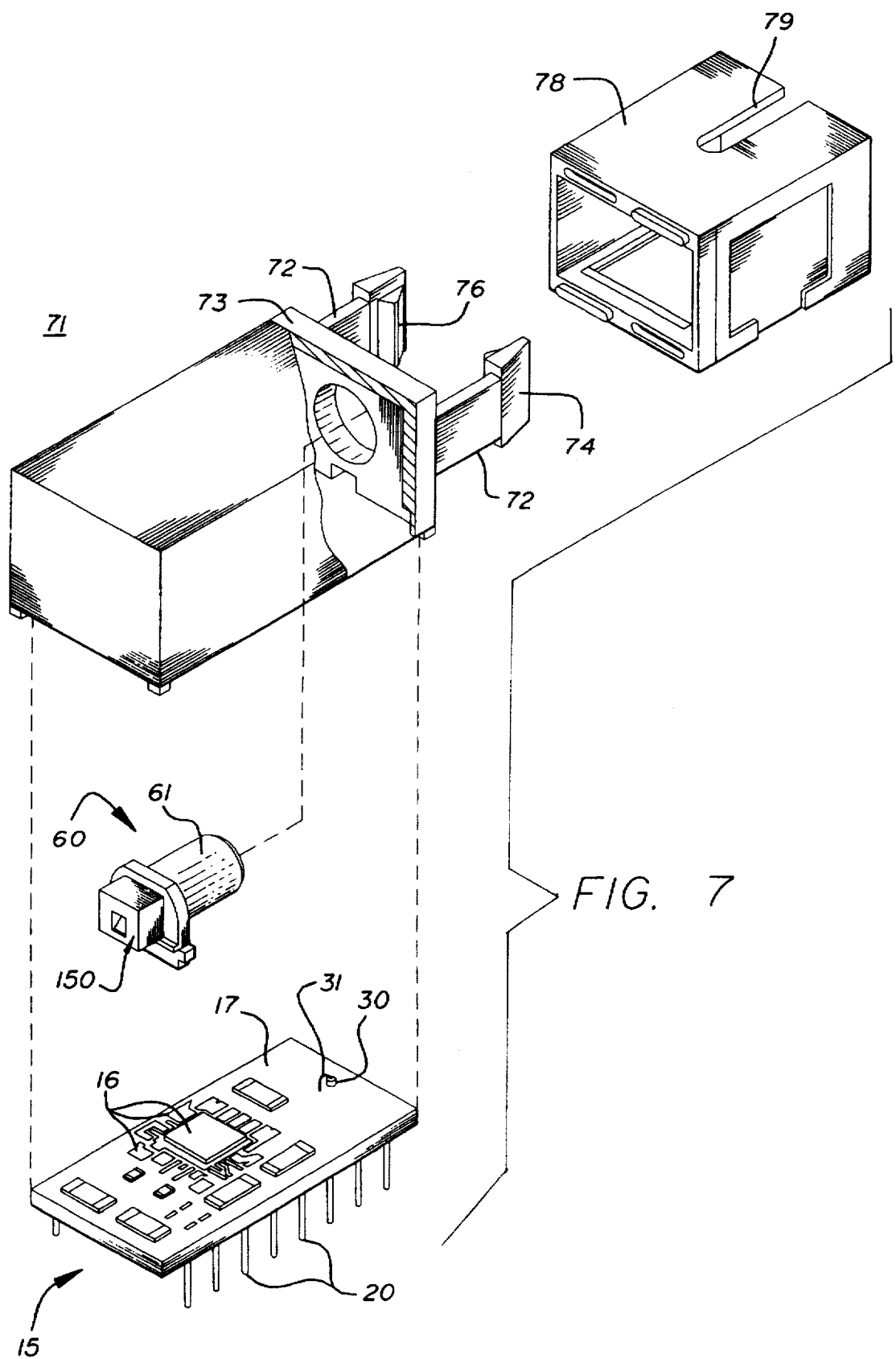
FIG. 7 is a cut-away-exploded perspective view of one half of an alternative simplex connector in which the top and side walls of the casing are cut-away in order to facilitate illustration of the assembly of the connector.
Figure 8:
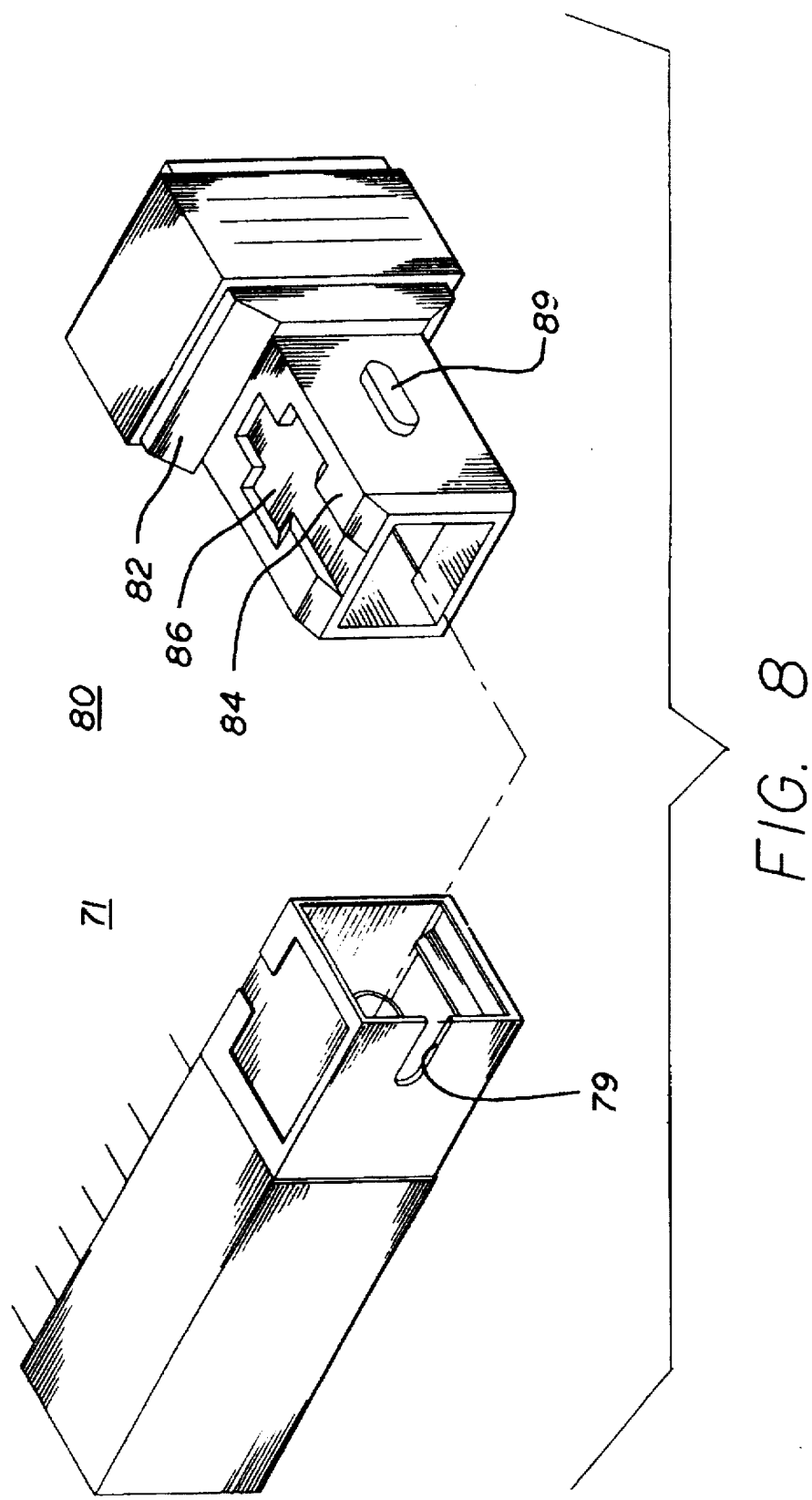
FIG. 8 is a perspective view of both portions of a simplex connector in accordance with one embodiment of the present invention.
Figure 9:
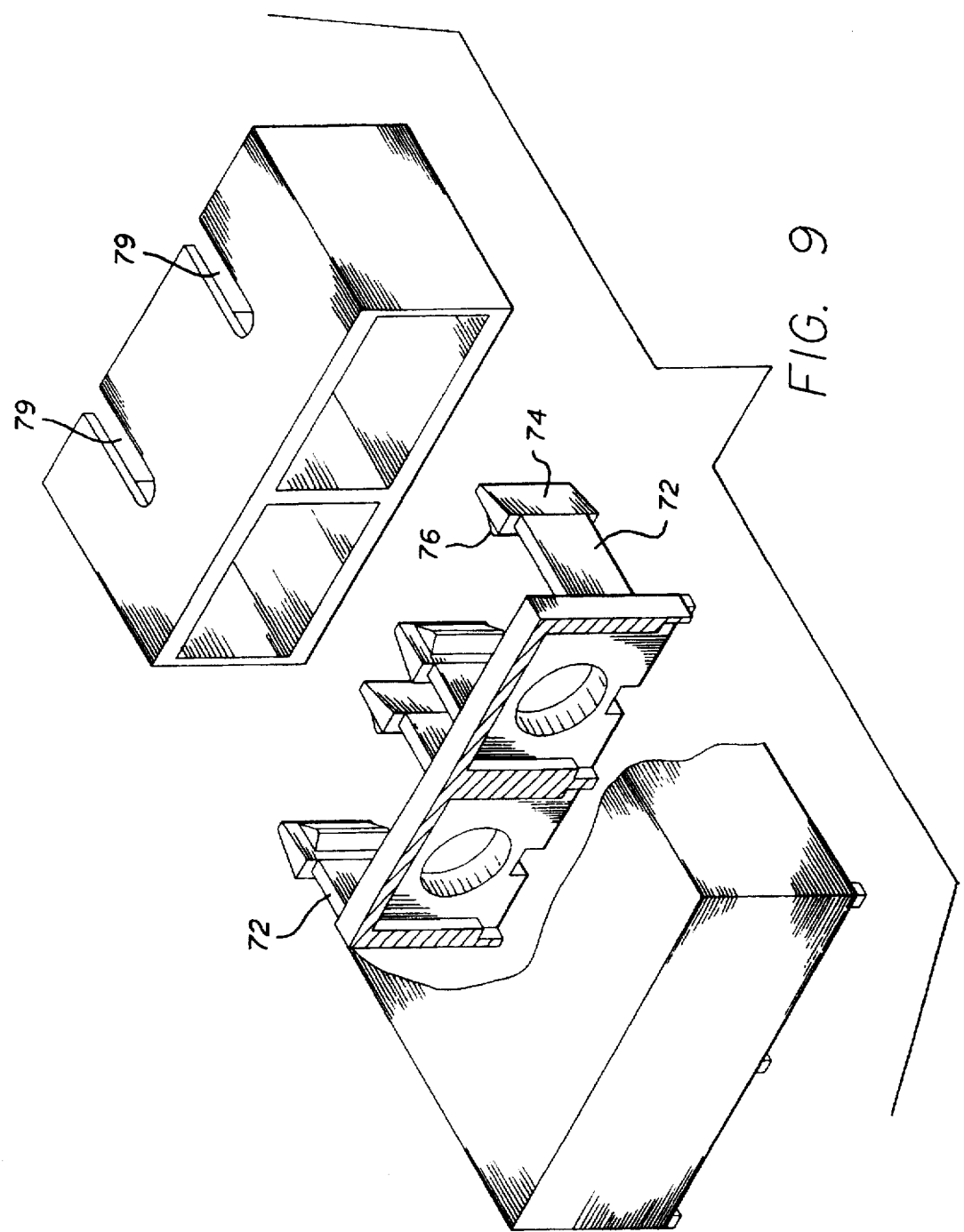
FIG. 9 is a cut-away-exploded perspective view of one half of an alternative duplex connector in which the top and side walls of the casing are cut-away in order to facilitate illustration of the assembly of the connector.
Figure 10:
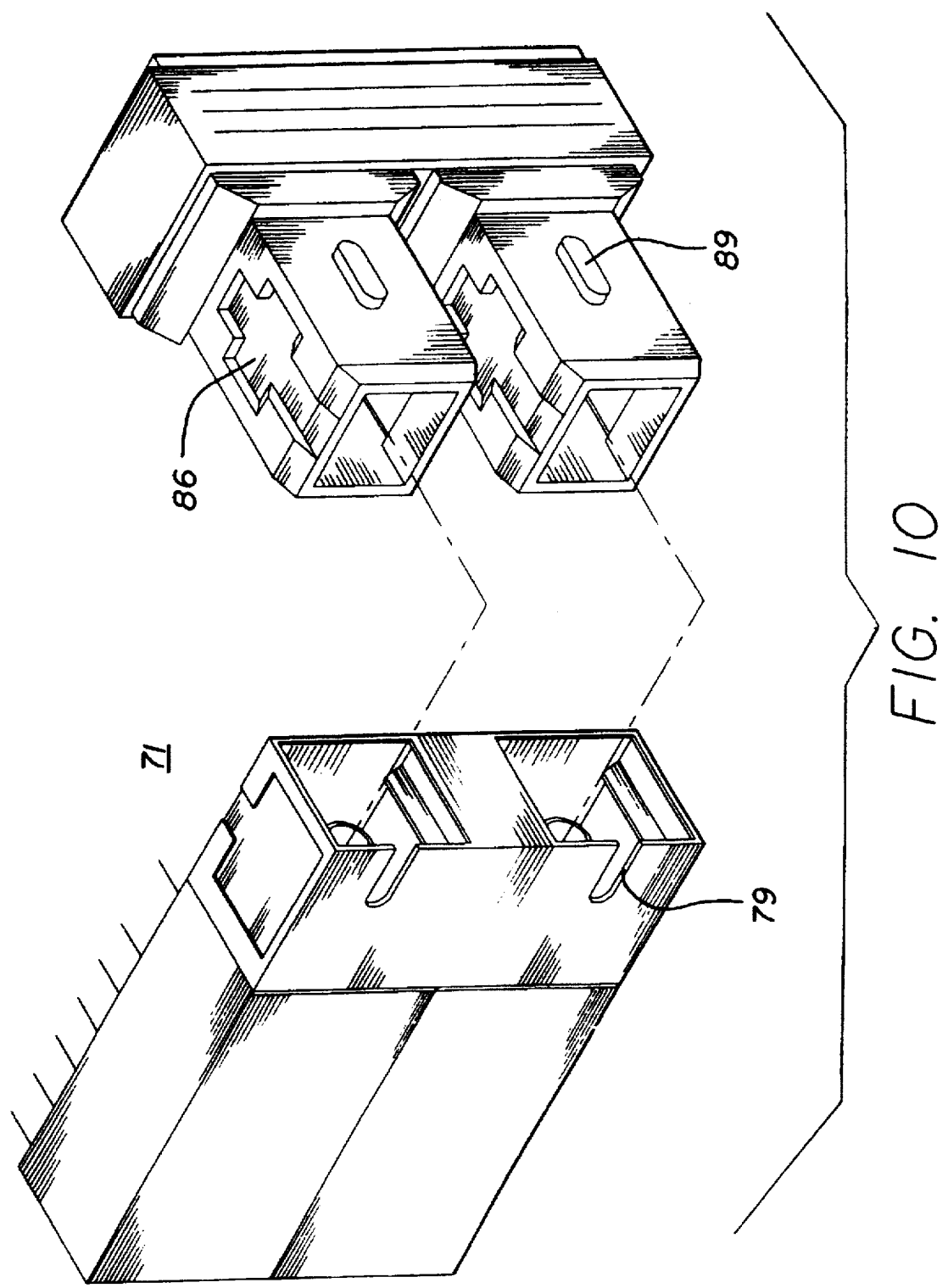
FIG. 10 is a perspective view of both portions of a duplex connector in accordance with an embodiment of the present invention.

FIGS. 7, 8, 9 and 10 show alternative connector embodiments to FIG. 6 in accordance with the present invention. FIGS. 7 and 8 illustrate a simplex connector embodiment. FIGS. 9 and 10 illustrate a duplex connector embodiment.

Both embodiments utilize connectors characterized as SC connectors, which are shown and described in U.S. Pat. No. 5,042,891 entitled "Active Device Mount Assembly with Interface Mount for Push-Pull Coupling Type Optical Fiber Connectors," and which are assigned to AMP Incorporated of Harrisburg, Pa., assignee of the present invention. U.S. Pat. No. 5,042,891 is incorporated herein by reference, as if set forth in full.

Referring to FIGS. 7 and 8, the simplex embodiment utilizes first connector half 71 having a base 73 with at least two resilient catch pieces 72 extending outward from the base. The resilient catch pieces 72 are of cantilever form extending parallel to and on opposing sides of the longitudinal axis of the optical sleeve portion 61 and terminating in protrusions 74 and lip structures 76. A rectangular shroud 78 having a slot 79 surrounds and encases the catch pieces 72 and joins with base 73.

The second connector half 80 has a rear section 82 and forward section 84 with surfaces which form an opening 86 for mating with the first connector half. The forward section 84 couple with connector half 71 and between cantilever catch pieces 72. The shaped opening 86 has a notch to receive and dispose the protrusions 74 of the first connector half 71 and a longitudinal ridge 89 appearing on the outside to mate with slot 79. It is to be appreciated that the construction and operation of the duplex connector shown in FIGS. 9 and 10 is merely a duplicate of the embodiments of FIGS. 7 and 8.

Figure 11:
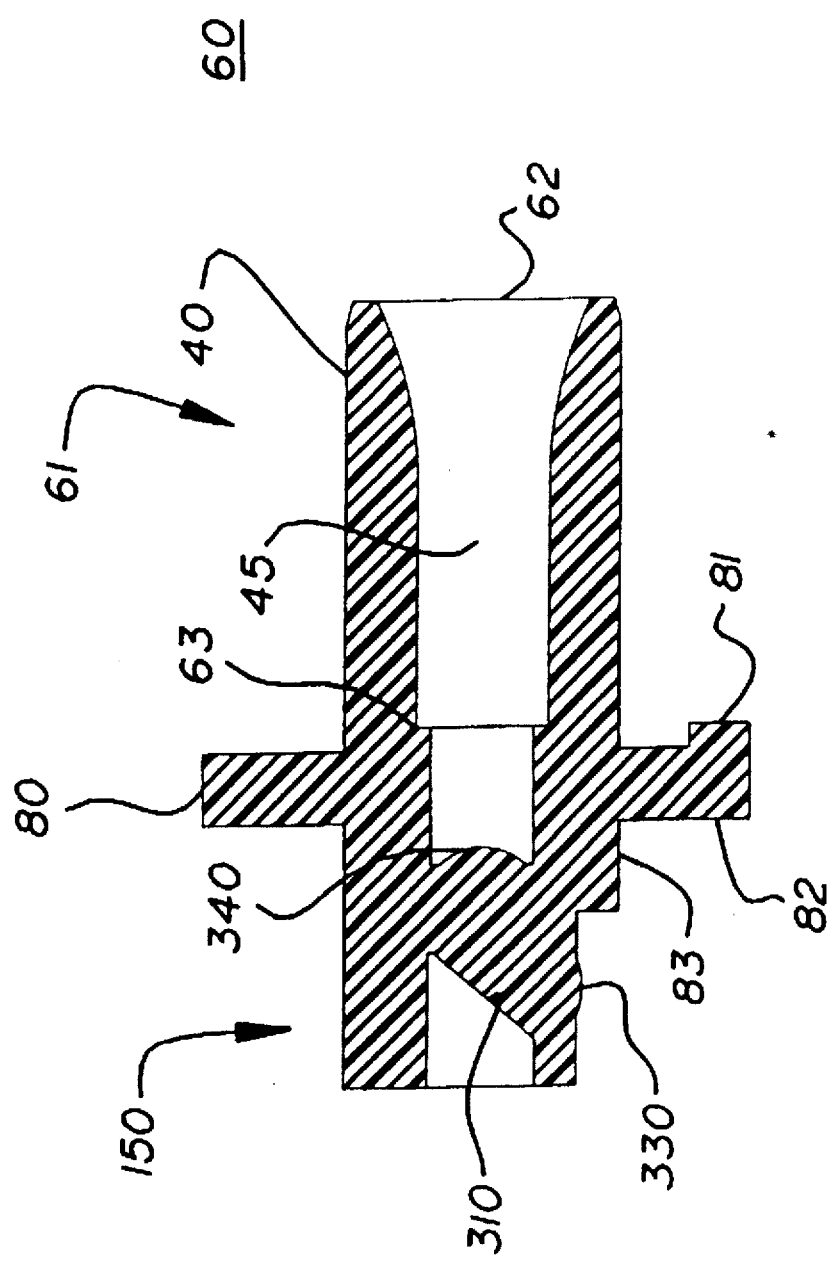
FIG. 11 is a cross-sectional view showing the optical coupling device in accordance with one embodiment of the present invention adaptable for use in a connector of the type shown in FIG. 6.

With additional reference now to FIG. 11, coupling device 60 comprises an optical sleeve portion 61 connected to light bending means 150. The optical sleeve portion 61 is adapted to receive and removably mount the ferrule 202 of a fiber optic transmission line 203. In the preferred embodiments of the Figures, optic sleeve portion 60 comprises a substantially cylindrical sleeve 40 having a substantially cylindrical bore 45 therein. At a first end of the sleeve 40, bore 45 defines a substantially circular opening 62 through which the ferrule 202 enters the sleeve. Light bending means 150 is disposed at the opposite end of the optical sleeve 40 in optical communication with bore 45. Bore 45 thus defines an optical path leading to the second end of the sleeve 40 and to light bending means 150. Furthermore, the bore 45 is adapted to operatively associate with the ferrule 202 of the optical fiber 203 such that the light transmission axis of the fiber optic transmission line is substantially coincidental with the axis of the bore. That is, the axial bore 45 is precisely molded in the sleeve so as to define all critical radial and longitudinal alignment surfaces which are determined on the basis of the dimensions of the fiber optic connector ferrule which is to be inserted in the axial bore. In particular, axial bore 45 includes a shoulder 63 precisely axially located on the interior portion of bore 45. After the fiber optic ferrule is coupled with the optic sleeve 40, the end or some other portion of the ferrule 202 will be maintained in intimate contact with shoulder 63. As a result of the maintenance of this intimate contact, the distance between the focusing lens 340 and the end 205 of the fiber optic transmission line 203 is precisely fixed. This distance may be an important parameter in effective operation of the present fiber optic coupling devices. This distance preferably corresponds to the image plane of OED 30.

According to preferred embodiments of the present invention, coupling device 60 is integrally formed, such as by molding of fluent plastic material, in order to eliminate tolerance build-up which may be otherwise associated with the assembly of the various components thereof. It is preferred that the coupling device be formed from a moldable plastic material, and preferably one of the more high performance engineering plastic materials, such as polycarbonate, polyether-imide or polyarylsulfone. Furthermore, it is preferred that the material used to form the casing 50 of the present invention, including the mating sleeve portion 70 thereof, be substantially opaque so as to minimize spurious signals caused by stray light. Suitable materials for this purpose include plated natural and carbon filled polyarylsulfone, liquid crystal polymer, and zinc. The molding may be accomplished utilizing any well known technique, including, but not limited to, injection molding, compression molding or transfer molding. An advantage of using a molded coupling device 60 in accordance with the present invention is that the shape and relative dimensions of the optic sleeve 40 and the light bending means 50 may be precisely controlled so as to minimize the occurrence of tolerance build-up.

It is preferred that the optical axis of lens element 340 substantially coincides with the axis of bore 45. In this way, the optical axis of lens 340 will be substantially aligned with the light transmission axis of a fiber optic cable which is mounted to the coupling device 60. Once again, it is generally preferred that coupling device 60 be an integral or unitary coupling device so that any tolerance build-up associated with obtaining such alignment between lens 340 and the axis of the bore 45 is eliminated or substantially reduced. In preferred embodiments of the present invention, therefore, light bending means 150 includes a lens 340 integrally formed to provide a closed end of bore 45. Since lens 340 is integrally formed in the closed end of the bore 45, the relative axial and radial positions of the lens element and the bore, including shoulders 63 thereof, can be established within precise tolerance limits.

Figure 12:
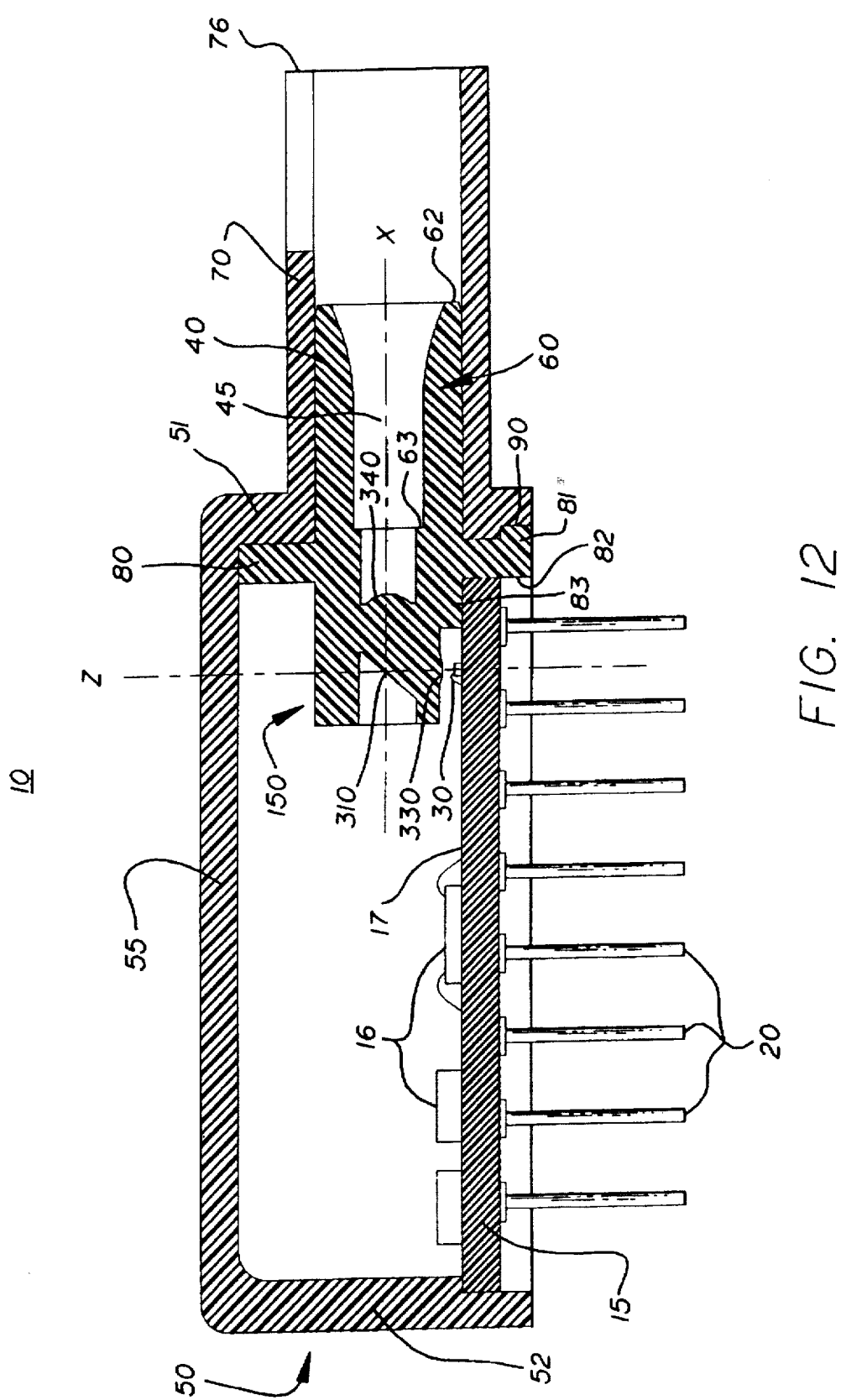
FIG. 12 is a cross-sectional view of the assembled connector shown in FIG. 6.

The light bending means 150 shown in FIGS. 6, 11 and 12, thus comprises a first lens 340, a reflecting surface 310 and a second lens 330. Each of these elements is preferably integrally formed as a unitary element with optical sleeve 61. The surface 310 of light bending means 150 together with the surfaces containing the first and second lenses 340 and 330 respectively, preferably comprise a totally internally reflecting prism having focusing surfaces associated therewith.

The coupling device 60 also includes an outer flange 80 for facilitating mounting of the coupling device 60 to the casing generally and the mating sleeve 70 in particular. As best illustrated in FIG. 12, a key 81 projects from the lower portion of flange 80 and is adapted to mate with a receiving slot 90 in the lower portion of sidewall 51. The key 81 in flange 80 and the slot 91 in sidewall 51 together comprise first means for aligning the light bending means 150 in operative optical association with OED 30. In particular, it will be appreciated by those skilled in the art that such key/slot arrangement provides means for aligning the optical axis Z of the first collimating lens 330 so as to be substantially normal to the printed circuit board 15. Furthermore, flange 80 preferably includes a first datum surface 82 against which the front edge of circuit board 15 is seated in the assembled coupling device. As is illustrated in FIG. 7, datum surface 82 is formed to provide a planar surface which is substantially parallel to the optical axis of lens 330 so as to provide a precise reference point for establishing axial alignment between OED 30 and lens 330. Since the preferred coupling devices of the present invention are integrally formed, unitary elements, the precise axial distance between datum surface 82 and the focal axis of lens 330 can be precisely established during the process of forming the coupling device. As a result, the optical axis Z of OED 30 will be aligned with the focal axis of lens 330 with only a relatively small amount of tolerance build-up.

Optical coupling device 60 further includes a second datum surface 83 which provides a precise reference surface for establishing the distance between the top surface 17 of printed surface board 15, and hence the active area 35 of the OED 30 and lens 330.

It will be appreciated that the coupling device 60 of the present invention greatly facilitates assembly of the present connectors and minimizes undesirable tolerance build-up during the assembly process. In particular, as best illustrated with reference to FIGS. 6 and 12, assembly of a connector preferably proceeds by initially inserting the optical sleeve 61 of coupling device 60 through sidewall 51 and into the bore 75 of the mating sleeve 70. Proper angular orientation of the light bending means 150 of coupling device 60 with mating sleeve 70 is substantially ensured by the engagement of key 81 in slot 90. In particular, the engagement of key 81 in slot 90 ensures that the datum surface 83 is substantially normal to the sidewalls 53 and 54 and substantially parallel to the top wall 55. In this way, datum surface 83 is in a position to accept and mate with the upper surface 17 of printed circuit board 15. The optical coupling device 60 is then joined in such aligned position to casing 50. Once the coupling device 60 is thus joined to the casing 50, printed circuit board 15 is joined to the casing. Datum surfaces 82 and 83 ensure that OED 30 is substantially optically aligned with lens 330. Joining of the respective elements of the connector 10 may be achieved by any means well known in the art, such as by an appropriate epoxy or similar adhesive, or ultrasonic welding. Once assembled, OED 30 is in operative optical association with lens 330 of light bending means 150. Furthermore, when the coupling fixture of a fiber optic connector is mated to mating sleeve 70, the ferrule 202 mates to bore 45 and is in operative optical association with lens 340 of light bending means 150.

Figure 13:
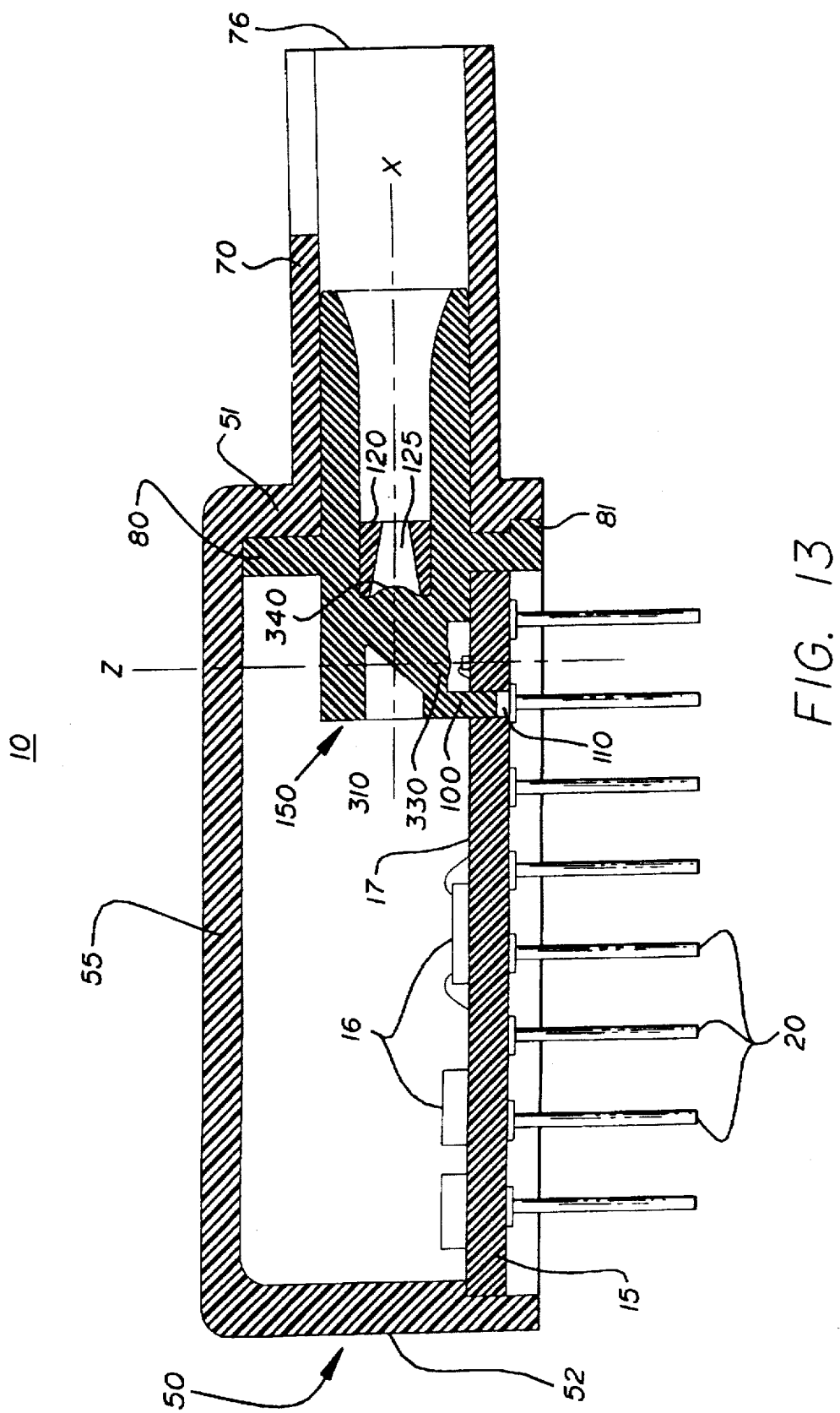
FIG. 13 is a cross-sectional view of a second embodiment of a connector assembly in accordance with the present invention.

According to certain embodiments, as shown in FIG. 13, optical coupling device 60 further includes additional alignment means for ensuring that the optical axis of lens 330 is laterally aligned with the operative axis Z of the OED. In such embodiments, such lateral alignment means comprises one or more alignment pegs 100 depending from the optical coupling device 60. During the assembly operation, such pegs are adapted to precisely mount in sockets 110 contained in printed circuit board 15. Such sockets are formed in circuit board 15 during the manufacture thereof so as to be precisely positioned with respect to the operative axis Z of the OED 30. Furthermore, the position of peg 100 relative to lens 330 may also be precisely fixed during the formation of optical coupling device 60. As mentioned hereinbefore, it is preferred that optical coupling device 60 is a unitary coupling device formed by molding fluent plastic material into a precisely defined shape and configuration. It will be appreciated by those skilled in the art that the tolerance limits between and among the various components of the optical coupling device are thus defined in accordance with a single molding operation. Accordingly, the use of such a single molding operation to produce the optical coupling device hereof substantially reduces the uncertainty and variability of the tolerance buildup associated with prior art devices.

The embodiment of FIG. 13 also differs from the embodiment of FIGS. 11 and 12 in that the shoulders 63 formed in bore 45 are eliminated and replaced by a spacing element 120 which defines a frusto-conically shaped cavity 125.

Figure 14:
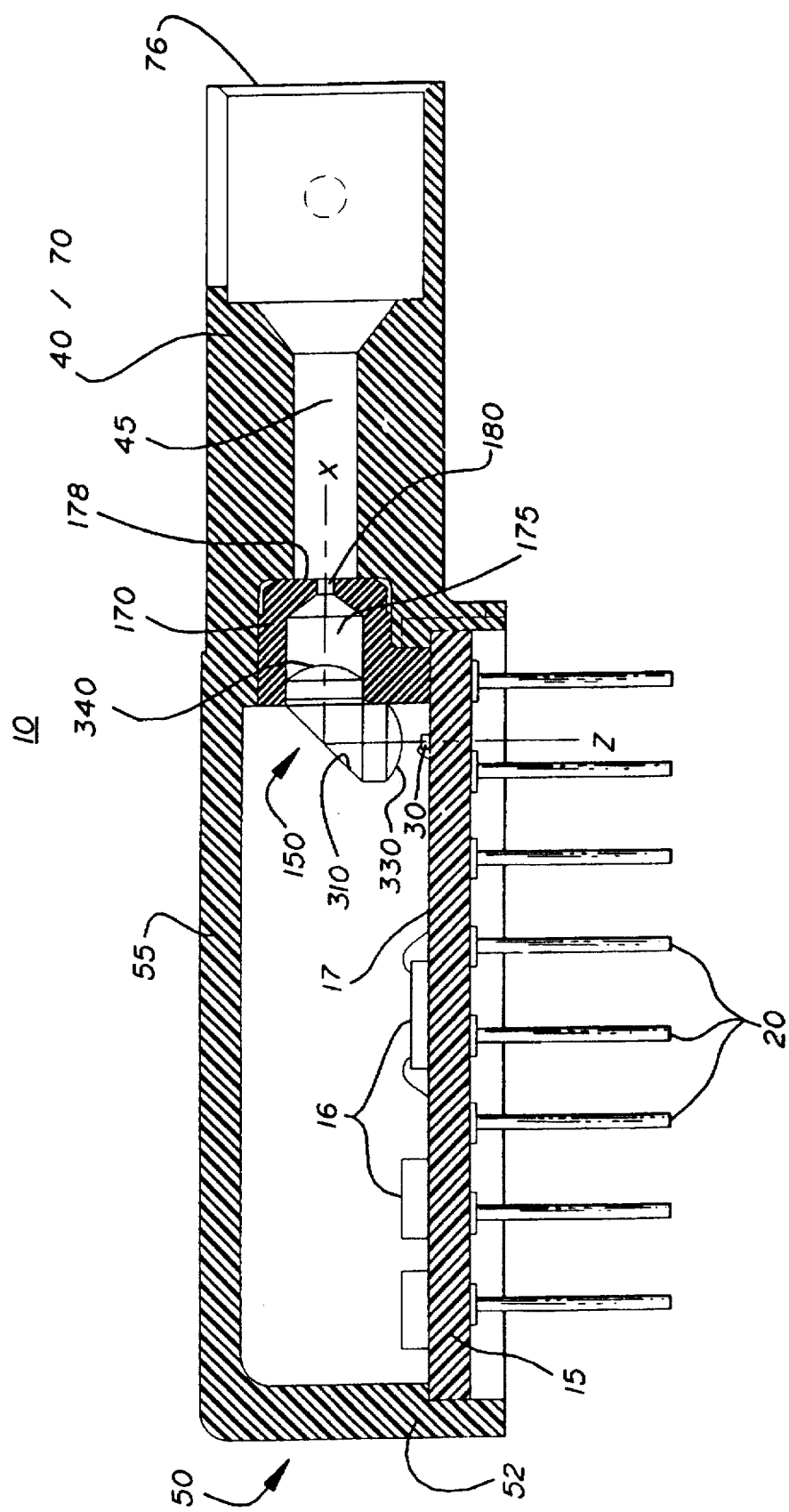
FIG. 14 is a cross-sectional view of yet a third embodiment of a connector assembly in accordance with the present invention.

A further embodiment of the present invention is illustrated in FIG. 14. In accordance with this embodiment, the optical coupling device comprises an optical sleeve 40/70 formed integrally with casing 50. In particular, casing 50 includes a sleeve 40/70 adapted to mount a ferrule 202. In addition, the sleeve 40/70 performs the same function as that performed by the mating sleeve 70 of FIGS. 11-13, that is, it is adapted to mate with the mounting fixture of the connector. The light bending means 150 of the coupling device comprises a first lens 340, an internally reflecting surface 310 and a second lens 330. The light bending means of this embodiment is preferably integrally formed of transparent plastic material of the type mentioned hereinbefore. The coupling device further comprises means for maintaining the light bending means 150 in operative optical association with the OED 30 and with the optical sleeve 40/70. In particular, the maintaining means comprises a housing jacket 170 having an axial bore 175 formed therein. The housing jacket 170 is joined to casing 50 through inner end of bore 45 in sleeve 40/70 such that the axis of bore 175 is substantially coincidental with the axis X of bore 45. Lens 340 is mounted in and closes a first end of the axial bores 45 and 175 such that the axis of lens 340 is aligned with axis X and such that the axis of lens 330 is aligned with the operative axis of 30. The housing jacket 170 includes an endwall 178 which partially closes axial bore 45. The endwall 178 includes a substantially circular opening 180 which provides an optical path along axis X to lens 340. Although the housing jacket 170 is illustrated in FIG. 10 as being a separate element which is mounted in bore 45, it will be appreciated that the bore 45 can be integrally formed to provide a cavity for mounting lens 340 therein.

It will be appreciated that the fiber optic coupling device of the present invention has numerous advantages over heretofore used coupling devices. For example, the present coupling device is effective for use with either a modulated light source or a photoelectric detector; that is, for either the transmitter or the receiver of a data transmission system. Furthermore, the present connector system allows the OED, including all its associated electronic circuitry, to be directly mounted on a printed circuit board with a minimum number of soldered or wire bonded connections. This assures high speed, low noise operation associated with the microelectronic assemblies. Furthermore, the present invention provides systems in which the OED 30 and its associated lens 330 are readily aligned and located with extreme precision.

What is claimed is:

1. A device for optically coupling a fiber optic transmission line to an optoelectronic device electrically interfaced to a substrate such that the operative axis of the optoelectronic device is substantially not coincidental with the light transmission axis of the fiber optic transmission line, the device comprising:

an optical sleeve having a first end and a second end with said optical transmission line disposed in said sleeve such that the light transmission axis of the fiber optic transmission line is substantially coincidental with an axis centered in said sleeve; and a prism disposed in the light transmission axis adjacent said second end of said sleeve and optically coupled to said fiber optic transmission line and said optoelectronic device, said prism reflecting light from said optic axis in a direction substantially orthogonal to the optoelectronic device, said sleeve and said prism being a unitary piece.

* * * * *